United States Patent
Chang et al.

(10) Patent No.: US 11,764,763 B1
(45) Date of Patent: Sep. 19, 2023

(54) METHOD AND APPARATUS FOR IN-SITU ON-CHIP TIMING

(71) Applicant: APPLE INC., Cupertino, CA (US)

(72) Inventors: Yikun Chang, Fremont, CA (US); Charles L Wang, Los Altos, CA (US); Chih-Yuan Chen, Santa Clara, CA (US)

(73) Assignee: APPLE INC., Cupertino, CA (US)

(*) Notice: Subject to any disclaimer, the term of this patent is extended or adjusted under 35 U.S.C. 154(b) by 0 days.

(21) Appl. No.: 17/981,507

(22) Filed: Nov. 7, 2022

Related U.S. Application Data

(60) Provisional application No. 63/406,270, filed on Sep. 14, 2022.

(51) Int. Cl.
  *H03K 3/033* (2006.01)
  *H03K 19/173* (2006.01)
  *H03K 3/03* (2006.01)

(52) U.S. Cl.
  CPC .......... *H03K 3/033* (2013.01); *H03K 3/0315* (2013.01); *H03K 19/1737* (2013.01)

(58) Field of Classification Search
  CPC ...................................................... H03K 3/033
  USPC ........................................................ 327/230
  See application file for complete search history.

(56) References Cited

U.S. PATENT DOCUMENTS

| | | | |
|---|---|---|---|
| 6,954,913 B2 | 10/2005 | Gauthier et al. | |
| 7,212,939 B2 | 5/2007 | Hsieh et al. | |
| 7,774,731 B2 | 8/2010 | Dasdan et al. | |
| 7,876,127 B2 | 1/2011 | Zheng et al. | |
| 9,305,622 B1 | 4/2016 | Jeter | |
| 10,209,298 B2 * | 2/2019 | Li | G01R 31/31725 |
| 10,318,699 B1 | 6/2019 | Sivaswamy et al. | |
| 10,775,833 B2 | 9/2020 | Kramer et al. | |
| 2002/0031199 A1 | 3/2002 | Rolston et al. | |

* cited by examiner

*Primary Examiner* — Tomi Skibinski
(74) *Attorney, Agent, or Firm* — KLIGLER & ASSOCIATES PATENT ATTORNEYS LTD

(57) ABSTRACT

An Integrated Circuit includes a target circuit, first and second logic chains, a feedback path and calibration circuitry. The target circuit includes first and second inputs. The first and second logic chains propagate a signal from a common input point to the first and second inputs of the target circuit, respectively. The feedback path receives the signal from the first or second input and feeds the signal back to the common input point. The calibration circuitry is configured to connect the first input to the feedback path thereby forming a first closed-loop oscillator circuit, and measure a first oscillation frequency of the first closed-loop oscillator circuit, connect the second input to the feedback path, thereby forming a second closed-loop oscillator circuit, and measure a second oscillation frequency of the second closed-loop oscillator circuit, and verify a timing constraint responsively to the first and second oscillating frequencies.

20 Claims, 8 Drawing Sheets

METHOD AND APPARATUS FOR IN-SITU ON-CHIP TIMING

CROSS-REFERENCE TO RELATED APPLICATIONS

This application claims the benefit of U.S. Provisional Patent Application 63/406,270, filed Sep. 14, 2022, whose disclosure is incorporated herein by reference.

FIELD OF THE DISCLOSURE

The present disclosure relates generally to integrated circuits, and specifically to measurement and calibration of delays in time-critical circuits.

BACKGROUND OF THE DISCLOSURE

High speed integrated circuits (ICs) sometimes include delay calibration circuitry.

U.S. Pat. No. 9,305,622, for example, discloses a method and apparatus for performing a data strobe-to-data delay calibration. In one embodiment, a data strobe signal, along with data, is conveyed from a memory controller to a memory. An initial delay calibration procedure may be performed to align the data and the data strobe signals at the memory, with subsequent calibrations performed to compensate for changes due to various factors such as voltage and temperature. In the calibrations performed, a calibrated delay value may be multiplied by a first scaling factor and a second scaling factor to generate a scaled code.

U.S. Pat. No. 6,954,913 discloses a system and method of determining an in-situ signal path delay on an integrated circuit. The system and method include inputting a first signal to a first input node of a first signal path and inputting a second signal to a second input node of a reference signal path. A phase of the first signal output from a first output node of the first signal path is compared to a phase of the second signal output from a second output node of the reference signal path. A phase error signal is output.

Lastly, U.S. Pat. No. 10,209,298 discloses a delay measurement circuit, including a transporting path selector, first and second delay measurement devices, and a controller. The delay measurement circuit forms a plurality of transporting loops through two of a first reference transporting conductive wire, a second reference transporting conductive wire, and a tested transporting conductive wire according to a control signal.

SUMMARY OF THE DISCLOSURE

An embodiment that is described herein provides an Integrated Circuit (IC) including a target circuit, first and second logic chains, a feedback propagation path and calibration circuitry. The target circuit includes first and second inputs having a timing constraint therebetween. The first logic chain is configured to propagate a signal from a common input point in the IC to the first input of the target circuit. The second logic chain is configured to propagate the signal from the common input point to the second input of the target circuit. The feedback propagation path is configured to selectably receive the signal from the first or second input of the target circuit, and to feed the signal back to the common input point. The calibration circuitry is configured to (i) connect the first input of the target circuit to the feedback path thereby forming a first closed-loop oscillator circuit including the first logic chain and the feedback propagation path, and measure a first oscillation frequency of the first closed-loop oscillator circuit, (ii) connect the second input of the target circuit to the feedback path, thereby forming a second closed-loop oscillator circuit including the second logic chain and the feedback propagation path, and measure a second oscillation frequency of the second closed-loop oscillator circuit, and (iii) verify the timing constraint responsively to the first and second oscillating frequencies.

In some embodiments, to verify the timing constraint, the calibration circuitry is configured to estimate a timing skew between the first and second inputs based on the first and second oscillating frequencies, and to verify whether the timing skew satisfies the timing constraint. In an embodiment, the first logic chain includes an adjustable delay element, and, to verify the timing constraint, the calibration circuitry is further configured to adjust the adjustable delay element responsively to the first and second oscillating frequencies, so as to meet the timing constraint.

In some embodiments the timing constraint is a predefined setup time. In some embodiments the timing constraint is a predefined hold time.

In some embodiments the calibration circuitry is configured to switch between (i) a normal mode in which an input signal is propagated to the target circuit via the first and second logic chains, and the feedback propagation path is disconnected, and (ii) a calibration mode in which the first and second closed-loop oscillator circuits are formed using the feedback propagation path and the first and second logic chains, and the timing constraint is verified.

In an example embodiment, the IC further includes a modified latch circuit (MLC) configured to (i) in the normal mode of the calibration circuitry, operate in a normal latching mode in which the MLC transfers a data input to a data output responsively to a level of a clock input, and (ii) in the calibration mode of the calibration circuitry, operate in a feed-through mode in which the MLC propagates the clock input to the data output after a delay, which matches the delay in the normal latching mode from the clock edge to the data output. In an embodiment, the MLC includes one or more gates, which are configured to force respective given logic levels on the MLC while in the calibration mode.

In some embodiments, the target circuit includes a synchronous logic stage, the first input is a data input for receiving a data signal, and the second input is a clock input for receiving a clock signal. In an example embodiment, the target circuit includes at least a latch that is configured to sample the data signal with the clock signal. In another example embodiment, the target circuit includes a multiplexer.

There is additionally provided, in accordance with an embodiment that is described herein, a method for verifying a timing constraint between first and second inputs of a target circuit within an Integrated Circuit (IC). The method includes, using a first logic chain, propagating a signal from a common input point in the IC to the first input of the target circuit, and using a second logic chain, propagating the signal from the common input point to the second input of the target circuit. Using a feedback propagation path, the signal is selectably received from the first or second input of the target circuit, and the signal is fed back to the common input point. Using calibration circuitry (i) the first input of the target circuit is connected to the feedback path, thereby forming a first closed-loop oscillator circuit including the first logic chain and the feedback propagation path, and measuring a first oscillation frequency of the first closed-loop oscillator circuit, (ii) the second input of the target circuit is connected to the feedback path, thereby forming a second closed-loop oscillator circuit including the second logic chain and the feedback propagation path, and measuring a second oscillation frequency of the second closed-loop oscillator circuit, and (iii) the timing constraint is verified responsively to the first and second oscillating frequencies.

The present disclosure will be more fully understood from the following detailed description of the embodiments thereof, taken together with the drawings in which:

DETAILED DESCRIPTION OF EMBODIMENTS

Overview

Figure 1:
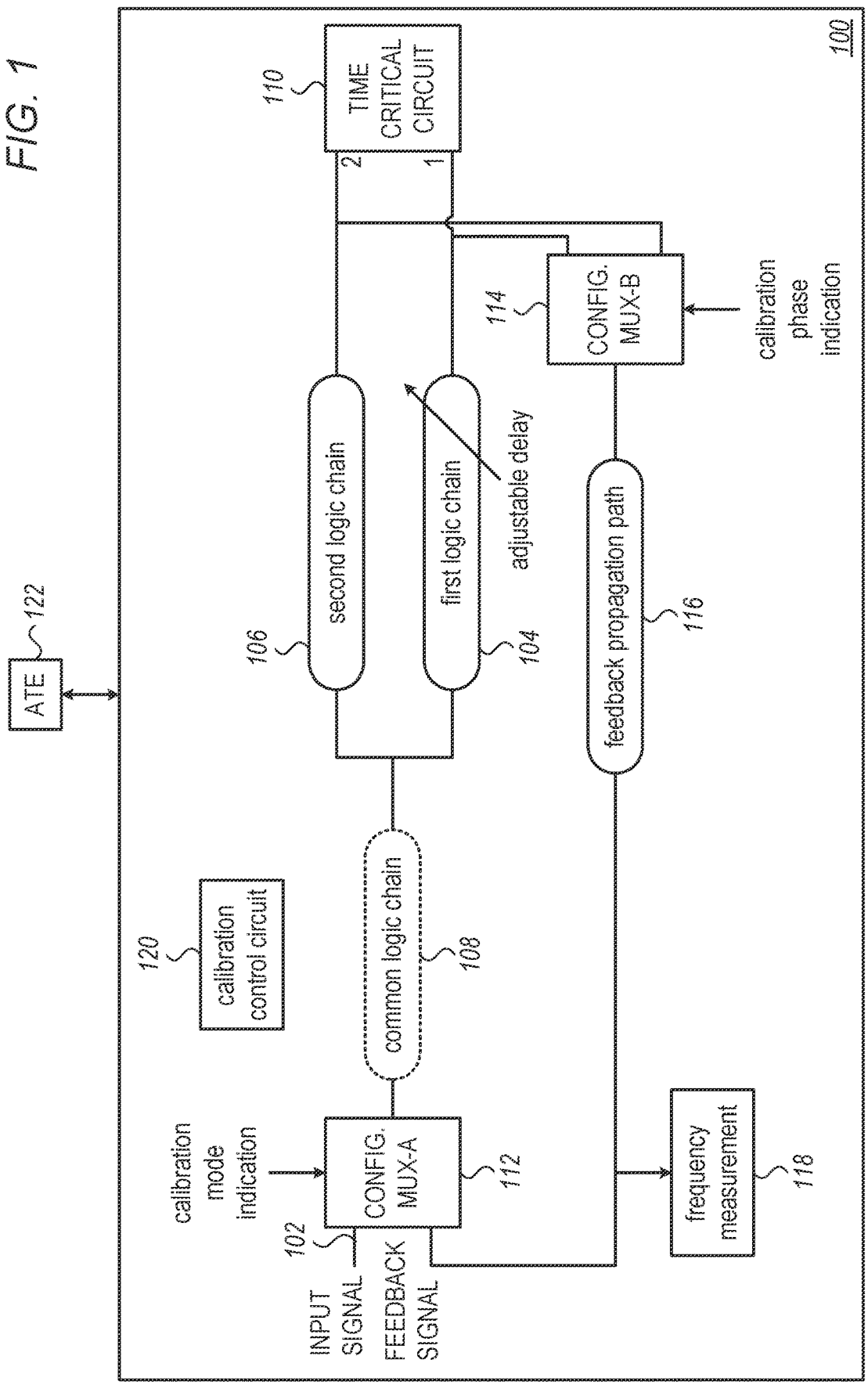
FIG. 1 is a block diagram that schematically illustrates an IC with in-situ timing calibration, in accordance with an embodiment that is described herein.

Synchronous logic techniques are widely used in modern ICs (e.g., CPUs, GPUs and I/O links) to guarantee stable and reliable operations of complex logic circuits. The circuit is decomposed to simple stages, and a clock signal provides a rhythm to propagate signals between stages. As a result, an electronic system may include tens of thousands of synchronous (clocked) logic stages, including, for example, latches, flip-flops, multiplexers and de-multiplexers.

A synchronized logic stage takes two types of inputs: a data input (one or more) and a clock input (typically one). Responsively to a predefined pattern on the clock input (e.g., rising edge, falling edge, logic-high or logic-low) the logic stage outputs a combinational function of the inputs to one or more outputs, which are then input to a next synchronous logic stage (or to multiple synchronous logic stages).

To guarantee correct operation of each logic stage, certain timing specifications must be observed, e.g., a setup-time specification and a hold-time specification. Generally, setup-time defines the required time-period prior to a given clock edge in which the data input to the synchronous logic stage needs to be valid, whereas hold-time defined the time-period in which the data input should remain active after a given clock edge.

The difference in arrival time between data and clock inputs is critical for correct operation of the synchronous logic stages. If the arrival time difference does not meet the setup or hold time requirement, the circuit may malfunction, e.g., enter meta-stability.

In high performance ICs, signal paths may be long, and may present varying delays; when the clock frequency is relatively high, meeting the setup and hold specifications over a range of process-parameters/voltage-ranges/operating-temperatures (PVT) may be challenging.

Embodiments according to the present disclosure present methods and circuits to measure delays of IC critical paths in-situ and to adjust in-circuit delays to guarantee given setup and/or hold time specifications at target circuits of the IC, by adding only a small amount of circuitry and with little effect on the performance of the IC. In embodiments, the IC may be in a Calibration Mode, or a Functional Mode; while in Calibration mode, the IC is configured to estimate and adjust the setup and/or the hold time of time-critical circuits in the IC (we will use hereinbelow the terms "target circuit", "time-critical circuit" and "target time-critical circuit" interchangeably).

In an embodiment, a common signal source is propagated, in both Functional and Calibration modes, to a first and a second input of a time-critical circuit (e.g., to a clock input and to a data input). Since the delays of the paths to the first and the second input may vary (e.g., due to PVT variations) the IC is configured to, when in Calibration Mode, measure and correct the delays to achieve predefined setup and/or hold times.

In embodiments, the IC includes configuration multiplexers that, in Calibration Mode, sequentially form a first and a second oscillation loops, the first loop including the propagation path from the common signal to the first input of the target time critical circuit, and the second loop including the propagation path from the common signal to the second input (in some embodiments, an inverter is added to oscillating loops that have an even number of inversions). Both loops include propagation paths that are common to the first and the second path (if such common paths exist).

In some embodiments, the IC is configured to measure the oscillation frequencies of the first and second oscillating loops. As will be shown below, the difference in the delays from the common signal to the two inputs of the target circuit is very close to half of the difference between the period times of the two oscillating loops.

In an embodiment, one or both propagation paths include an adjustable delay gate; a calibration control circuitry (in the IC, in an external calibration device, or in a combination of an external device and an in-IC circuitry) may calibrate the setup and/or hold time by measuring the period times of the oscillating loops and adjusting the delay of the adjustable delay gate.

In some embodiments, one or both paths may include a latch, wherein the path from clock to data-out within the latch is part of signal propagation path from the common signal to an input of the target time critical circuit. In an embodiment, the latch includes gates that are transparent when the IC is in Functional mode; when the IC is in Calibration mode, however, that gates force a first logic level on the output of the latch when the clock input is at logic high, and a second logic value when the clock is at logic low. The gates are configured so that the delay from clock to output of the latch will be the same whether the IC is in Calibration mode or Functional mode.

DESCRIPTION OF EMBODIMENTS

As performance of ICs keeps increasing, the same computation needs to be done faster. The time slot for each synchronous logic stage decreases to allow higher operating frequencies. For example, in today's Input/Output (I/O) links, clock frequency has reached more than ten giga hertz, meaning less than 100 pico-seconds for a single synchronous logic stage and even less time is left for setup and hold time margins.

What's worse, in advanced IC technology, timing margin becomes more sensitive to variation of process, voltage and temperature (PVT) due to small lithography and low supply voltage. Moreover, even in the same IC at the same temperature and voltage, the parameters of identical circuits may differ according to the physical location of the transistors. Thus, pure simulation is sometimes not accurate enough to cover all timing information for calibration, and an on-chip measuring method may be needed to adjust internal delays.

In embodiments, simple circuitry is added to one or more timing-sensitive circuits in the IC, allowing delay measurement and subsequent adjustment, to guarantee setup and hold times.

According to embodiments, the IC may set to one of two modes—Functional mode, wherein the IC performs its specified functions, or a Calibration mode, wherein the IC is calibrated to meet a set of timing specification such as hold time and setup time.

FIG. 1 is a block diagram that schematically illustrates an IC 100 with in-situ timing calibration, in accordance with an embodiment that is described herein. An input signal 102 propagates through a first logic chain 104 and, in parallel, in a second logic chain 106. In some embodiments, the input signal also propagates in a common logic chain 108. Each of logic chains 104, 106 and 108 includes combinational logic gates (but may also include the combinational logic of a path through a latch, from a clock input to an output). In embodiments, each of logic chains 104, 106 may have additional inputs and/or additional outputs, that are not shown.

When IC 100 is in the Functional mode, the IC routes input signal 102 through first logic chain 104 (and, optionally, through common logic chain 108) to a first input of a time-critical circuit 110. In parallel, the IC routes input signal 102 through the second logic chain (and, optionally, through the common logic chain) to a second input of the time-critical circuit.

Time-critical circuit 110 requires predefined timing relationship between its inputs. For example, the timing-critical circuit may require that the second input is stable when the first input is at logic high, with a start setup-time margin (e.g., the time that the second input is stable before the first input transitions from low to high) and an end hold-time margin (e.g., the time that the second input remains stable after the first input transitions from high to low).

As explained above, in embodiments, the setup-time and hold-time margins may need to be calibrated. The calibration may be done during manufacturing (e.g., at the IC assembly test), or during the IC operation (e.g., upon system reset). A Configuration Multiplexer-A 112 routes a feedback signal to the first and the second logic chains (optionally, through the common logic chain) when the IC is in Calibration mode. At the same time, a Configuration Multiplexer-B 114, responsively to a Calibration Phase indication, routes either the first or the second input of time-critical circuit 110, to a feedback-propagation path 116, which outputs the feedback signal.

A calibration phase indication controls the routing in configuration multiplexer B. In embodiments, the Calibration phase indication will indicate a first phase followed by a second phase (more phases may be used in alternative embodiments). In some embodiments, configuration multiplexer B is configured to output a fixed logic value (e.g., logic 0) when the IC is in functional mode.

Thus, when in Calibration mode, the IC configures close loops; at a first calibration phase the loop includes configuration multiplexer A 112, optional common logic chain 108, first logic chain 104, configuration multiplexer B 114 and feedback propagation path 116. At a second calibration phase the loop includes configuration multiplexer A, the optional common logic chain, second logic chain 108, configuration multiplexer B and the feedback propagation path.

In embodiments, the number of inverting gates in each close loop is odd, and the close loops oscillates. (In some embodiments, IC 100 adds one or more inversion stages to keep the total number of inversions odd, for example, in the feedback propagation path.)

The oscillation period of the first closed loop is equal to:

$$2*(T_{cmA}+T_{clc}(\text{when used})+T_{flc}+T_{cmB}+T_{fpp})$$

whereas the oscillation period of the second close loop is equal to:

$$2*(T_{cmA}+T_{clc}(\text{when used})+T_{slc}+T_{cmB}+T_{fpp})$$

Where:

$T_{cmA}$ is the delay through Configuration Multiplexer A;
$T_{clc}$ is the delay through the common logic chain;
$T_{flc}$ is the delay through the first logic chain;
$T_{slc}$ is the delay through the second logic chain;
$T_{cmB}$ is the delay through Configuration Multiplexer B; and
$T_{fpp}$ is the delay through the feedback propagation path.

(We assume above that the delay through configuration multiplexers A and B, for either input to the output, is equal; in embodiments, the multiplexers include matched input to output paths, to minimize the delay variance.)

The difference between the period durations of the first and second closed loops is $2*(T_{flc}-T_{slc})$, which is equal to twice the mismatch between the paths to the first and second inputs of the time critical circuit.

IC 100 further includes a frequency measurement circuit 118, which is configured to measure the oscillation frequency of the first and the second closed loops. In some embodiments, to ease the measurement, frequency measurement circuit 118 includes a high-speed frequency pre-divider (e.g., divide-by-8). In an embodiment, the frequency measurement circuit buffers the feedback signal and routes the buffered signal to an output pad of the IC; in another embodiment frequency measurement circuit 118 includes a frequency pre-divider, and then routes the outputs of the pre-divider to an output pad of the IC. In some embodiments, on-chip frequency counters are used, which may measure the oscillation frequency in a various of methods that are known in the art.

In embodiments, frequency measurement circuit 118 may measure the frequency in other points of the close loops, such as the output of configuration multiplexer 114, a point within feedback propagation path 116 or the output of configuration multiplexer A or, if used, any point within common-logic-chain 108 (note that the latter two options may decrease the operation speed in Functional mode).

According to the example embodiment illustrated in FIG. 1, first logic chain 104 is adjustable; in some embodiments, logic chain 104 includes a variable delay gate, and the IC control the gate by changing an input of the variable delay gate, or, in an embodiment, by modifying a digital delay-control input of the variable delay gate.

In embodiment, a Calibration Control circuit 120 is configured to execute a delay calibration process, including the following steps: (i) activating the calibration indication; (ii) setting the calibration phase to a first phase; (iii), measure the frequency and calculate the period time of the first closed-loop; (iv) setting the calibration phase to a second phase; (v), measure the frequency and calculate the period time of the second closed-loop; (vi) adjust an adjustable delay gate in one of the logic-gate chains according to the difference between the calculated period times. In some embodiments the calibration control unit may repeat steps (i) through (vi) until a predefined time difference is reached.

In an embodiment, an external device, such as an Automatic Test Equipment (ATE) 122 controls the delay calibration process, in lieu of or along with calibration control circuit 120.

It should be noted that feedback propagation path 116 can be omitted. In practice, configuration multiplexer B may be remote from configuration multiplexer A, and the feedback propagation path includes a delay encountered when sending a feedback signal over a relatively long distance, often through one or more buffers.

It should further be noticed that the calibration process does not necessarily attempt to minimize the difference between the first and the second logic chains; in some embodiments the delay difference is adjusted to equal a predefine value, e.g., half a clock period.

Thus, in embodiment, by adding a small amount of logic, IC 100 can measure and adjust the difference between logic paths, to meet the requirements of time critical circuits.

The configuration of IC 100, illustrated in FIG. 1 and described hereinabove, is an example that is cited merely for the sake of conceptual clarity. Other configurations may be used in alternative embodiments. For example, time critical circuit 110 may have more time-critical inputs from other paths, some of which may adjusted by additional close-loops (in which case, configuration multiplexer 114 will have more than two inputs).

In some embodiments, the time critical circuit is a time-critical multiplexer that is configured to route a first or a second data input to an output, responsively to a select input. In embodiments, the select input is a clock signal, and the time critical multiplexer routes a first or a second input to the output, responsively to the clock phase.

Figure 2:
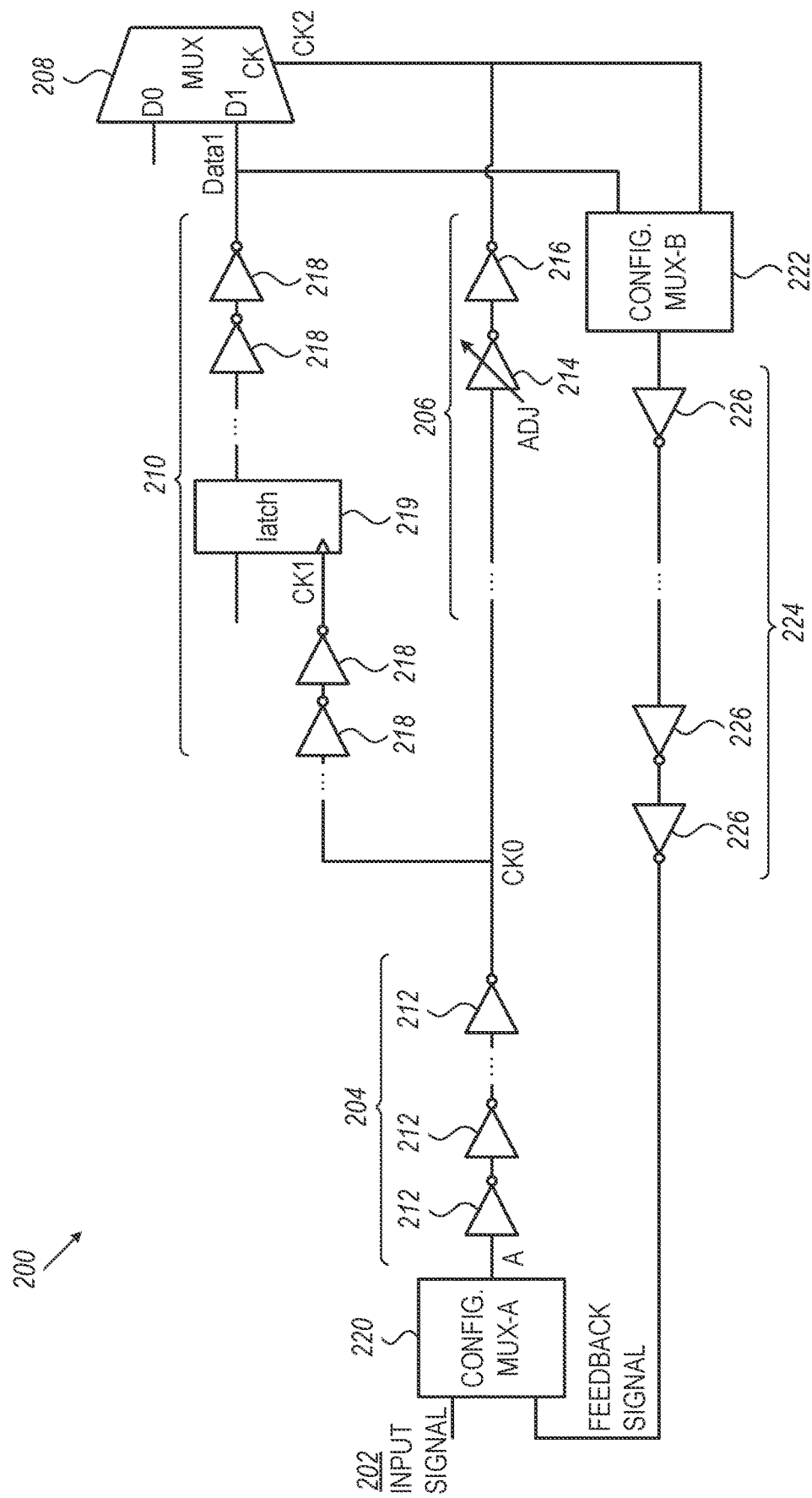
FIG. 2 is a block diagram that schematically illustrates the configuration of an IC, in accordance with an embodiment that is described herein.

FIG. 2 is a block diagram that schematically illustrates the configuration of an IC 200, in accordance with an embodiment that is described herein. FIG. 2 illustrates gate representation of the logic chains of FIG. 1 (which are also referred to as forward propagation paths). IC 200 is like IC 100 (FIG. 1), however, in IC 200 the first input of the time critical circuit is a clock signal having a clock frequency (and therefore toggles from "1" to "0" and from "0" to "1" at a total toggling rate (including both high to low and low to high transitions) of twice the clock frequency), whereas the second input is a data signal, that may change at the clock frequency.

A clock input signal 202 propagates through a common path 204, and then splits to a first forward propagation path 206 that is input to a first input of a time-critical circuit 208, and to a second forward propagation path 210 that is input to a second input of the time-critical circuit. In the second forward propagation path, the propagated clock samples a data input, which then propagates to the second input of the time critical circuit; hence, while the first input of the time critical circuit toggles twice in each clock period, the second input may change value at the clock frequency. (Timing critical circuit 208 may include other inputs, such as d0, which are not described herein, for the sake of conceptual clarity.)

The common forward propagation path 204 includes logic gates 212; the first forward propagation path 206 includes a variable-delay gate 214 and gates 216 (only one is shown); and the second forward propagation path includes gates 218 and a latch (from clock to data-out) 219. In embodiments, each of forward propagation paths 204, 206 and 210 may have additional inputs that are not shown, and, hence, either one of gates 212, 214, 216 may be a multiple input gates, such as And, Nand, Or, Nor, Exclusive-OR or Exclusive-Nor (note that the paths may also include single-input gates including the shown inverters, and non-inverting buffers).

A configuration multiplexer-A 220 is configured to route the input signal to the common forward propagation path 204 when IC 200 is in Functional mode, and to route a feedback signal to the common forward propagation routes when the IC is in Calibration mode. A configuration multiplexer-B 222, is configured to route the output of either the first or the second forward propagation path to a feedback propagation path 224, responsively to a calibration phase indication. Feedback propagation path 224 includes gates 226.

To measure the delay difference between the first and the second forward propagation paths, the IC enters the Calibration mode, and measures the oscillation frequencies of a loop including the first forward propagation path and a loop including the second forward propagation path. As shown above (with reference to FIG. 1), the difference between the oscillation periods equals, with high accuracy, to twice the delay difference between the forward propagation paths. IC 200 may then control the difference by adjusting the delay of variable delay gate 214.

According to the example embodiment illustrated in FIG. 2, time-critical circuit 208 includes a time-critical multiplexer, which is configured to route data inputs to a data output responsively to a select clock input (ck2); as will be described below, it is crucial that data inputs to the time-critical multiplexer are stable when routed to the output, and, hence, the timing relationship between path 206 and path 210 must be carefully defined and, in embodiments, calibrated.

The configuration of IC 200, illustrated in FIG. 2 and described hereinabove is cited by way of example. Other configurations may be used in alternative embodiments. For example, in some embodiments, time-critical circuit 208 may include a flip-flop.

Figure 3:
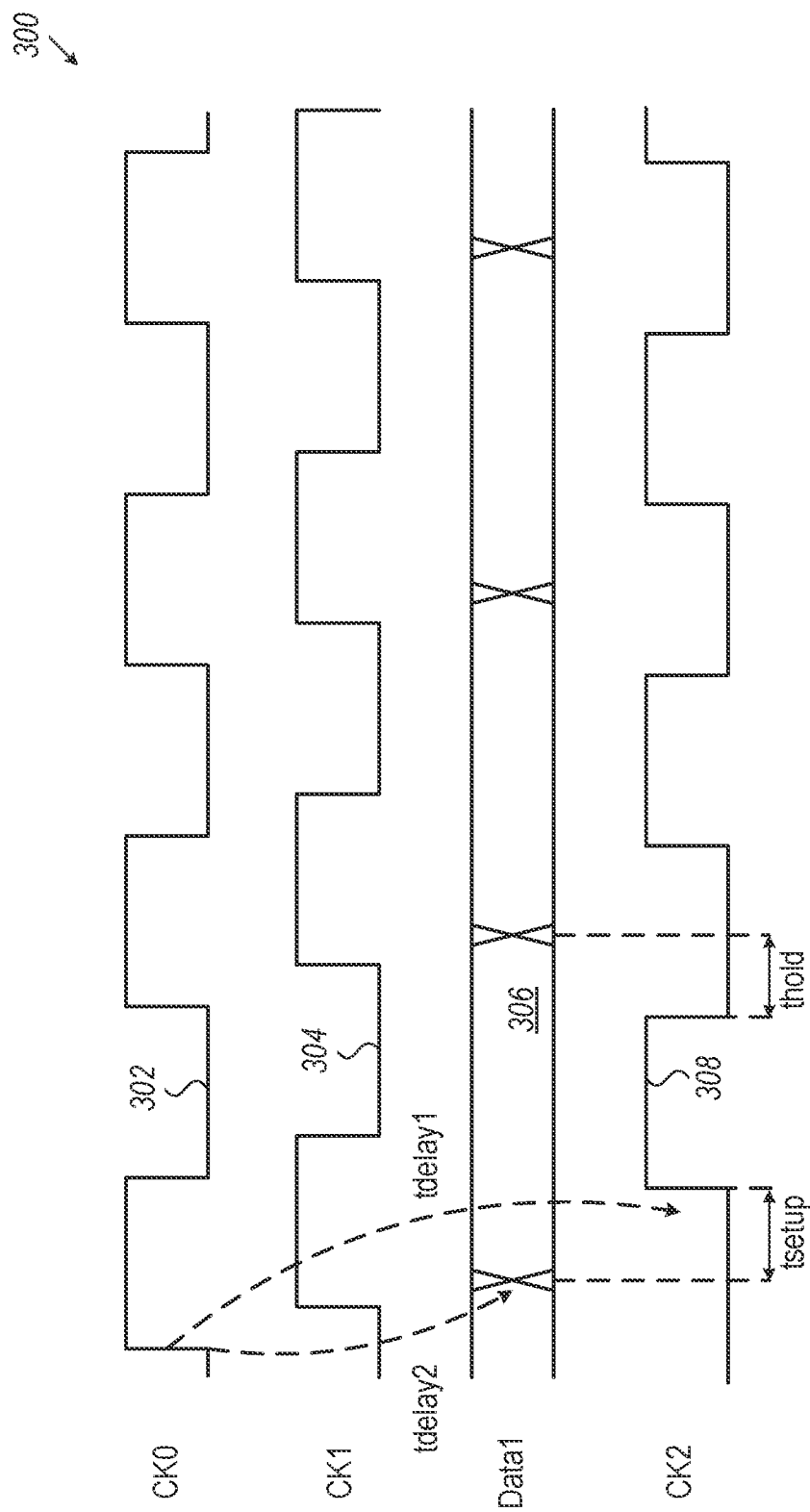
FIG. 3 is a timing diagram that schematically illustrates timing waveforms of signals in the IC, in accordance with an embodiment that is described herein.

FIG. 3 is a timing diagram 300 that schematically illustrates timing waveforms of signals in IC 200 (FIG. 2), in accordance with an embodiment that is described herein. A graph CK0 302 portrays the waveform of CK0—the input signal after forward propagation path 204; a graph CK1 304 portrays the waveform at point CK1—the clock input of latch 219; a graph 306 portrays the waveform at the second input (data1) of time-critical multiplexer 208, and a graph 308 portrays the waveform at the first input (CK2) of the time critical multiplexer (all referring to FIG. 2 above).

The delay from CK0 to CK2 is designated $t_{delay1}$, and the delay from CK0 to data-1 is designated $t_{delay2}$. In embodiments, IC 200 adjusts variable-delay gate 214 to assure that the setup time $t_{setup}=t_{delay1}-t_{delay2}$ and that $t_{hold-time}=t_{delay2}-t_{delay1}$–clock-low-time will be equal or greater than predefined minimum values.

Figure 4:
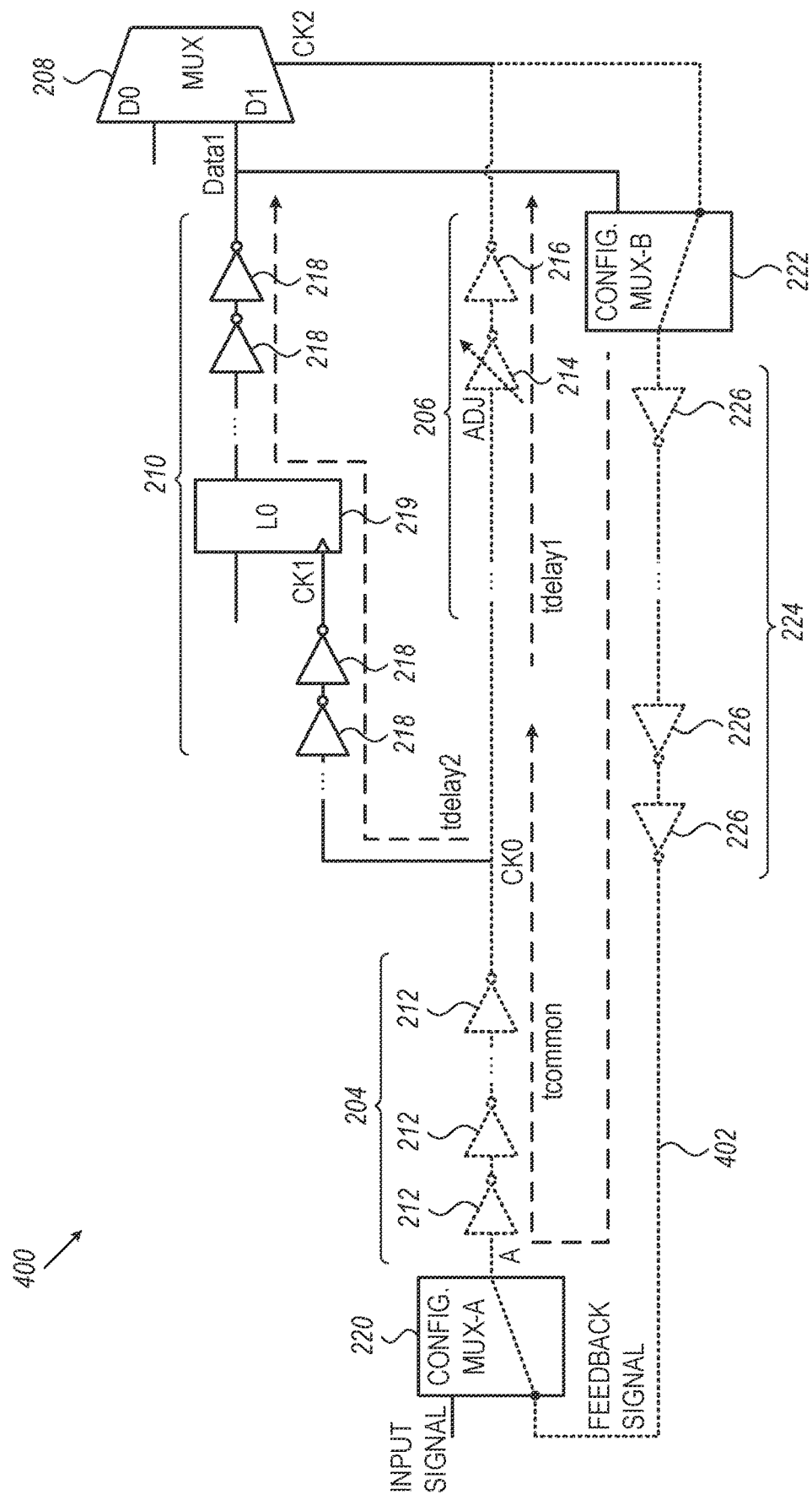
FIG. 4 is a block diagram that schematically illustrates an oscillation loop formed during a first calibration phase, in accordance with an embodiment that is described herein.

FIG. 4 is a block diagram 400 that schematically illustrates an oscillation loop 402 formed during a first calibration phase, in accordance with an embodiment that is described herein. The gates and paths are identical to the gates and paths illustrated in FIG. 2 above. IC 400 (identical to IC 200, FIG. 2) is in a first phase of the Calibration mode; responsively, Configuration multiplexer A 220 routes the feedback signal to common forward propagation path 204, Configuration multiplexer B 222 routes the CK2 signal (output of the first forward propagation path) to the feedback propagation path. As the number of logic inversions is odd, the configuration multiplexers create an oscillating closed loop 402, as indicated by the dashed line. The delay throughout the closed loop (e.g., half the oscillation period) includes a common delay $T_{common}$ that is common to both the first and the second oscillating loops, and a $T_{delay1}$ delay that is equal to the delay of the first forward propagation path. By measuring the oscillation frequency in closed-loop 402, the sum $T_{common}+T_{delay1}$ can be calculated.

Figure 5:
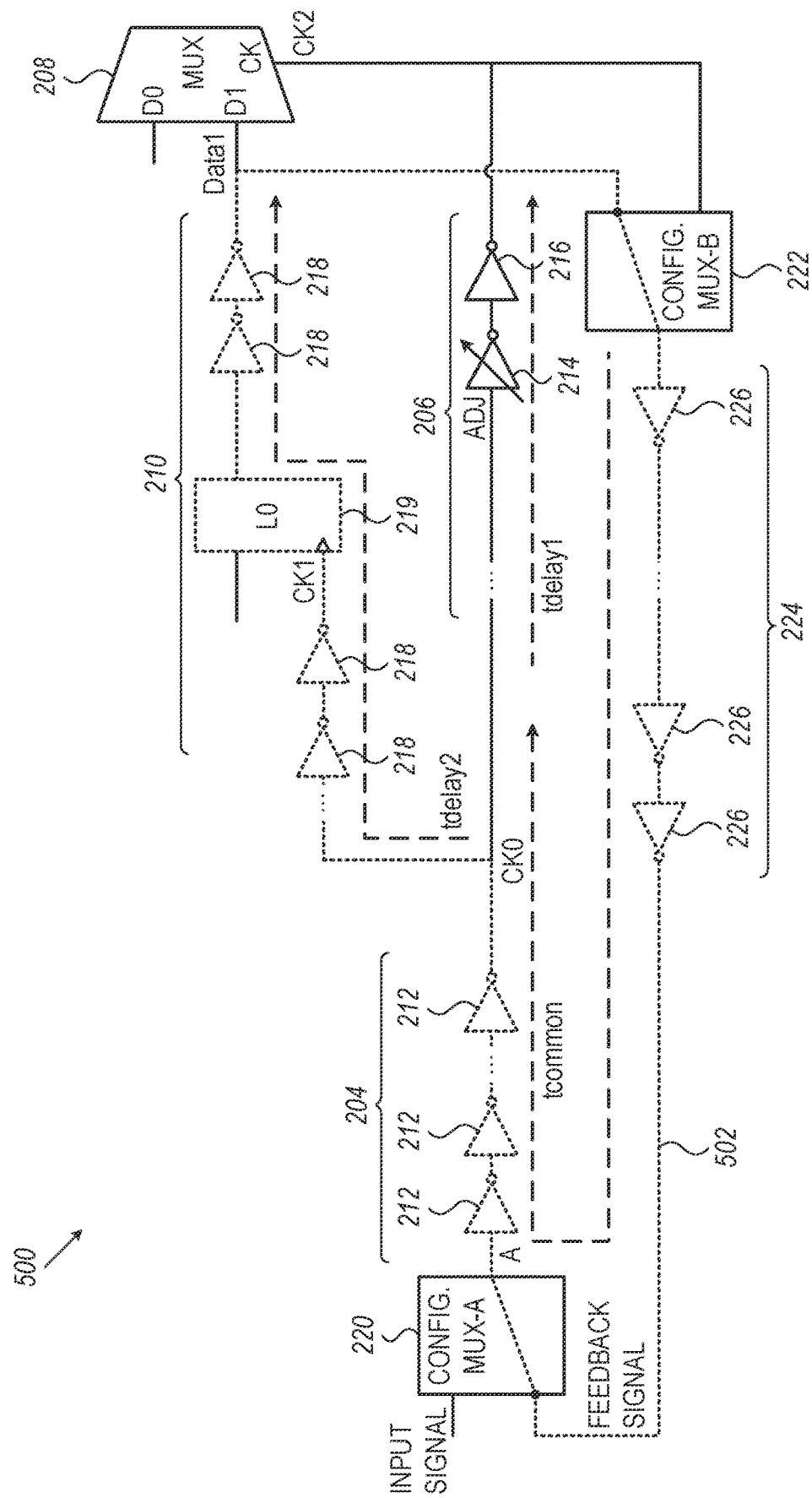
FIG. 5 is a block diagram that schematically illustrates in oscillation loop formed during a second calibration phase, in accordance with an embodiment that is described herein.

FIG. 5 is a block diagram that schematically illustrates in oscillation loop 502 formed during a second calibration phase, in accordance with an embodiment that is described herein. The gates and paths are identical to the gates and paths illustrated in FIG. 2 above. IC 500 (identical to IC 200, FIG. 2) is in a second phase of the Calibration mode; responsively, Configuration multiplexer A 220 routes the feedback signal to common forward propagation path 204, and Configuration multiplexer B 222 routes the data1 signal to the feedback propagation path. As the number of logic inversions in the closed loops is odd, the configuration multiplexers create an oscillating closed loop 502, as indicated by the dashed line. The delay throughout the closed loop (e.g., half the oscillation period) includes a common delay $T_{common}$ that is common to both the first and the second oscillating loops, and a $T_{delay2}$ delay that is equal to the delay of the second forward propagation path. By measuring the oscillation frequency in closed-loop 502, the sum $T_{common}+T_{delay2}$ can be calculated.

The configuration of IC 400 (and the identical IC 500) and of closed loops 402, 502, illustrated in FIGS. 3,4,5 and described hereinabove are examples shown for the sake of conceptual clarity. Other configurations may be used in alternative embodiments. For example, in some embodiments the time critical circuit is a latch and in other embodiments the time critical circuit is a D-type flipflop. In embodiments, configuration multiplexer B 222 includes more than two inputs, to form multiple closed loops for the adjustment of multiple forward propagation paths.

Calibration

As described above (with reference to FIG. 3), the forward propagation delay paths should be adjusted so that both $t_{setup}=t_{delay1}-t_{delay2}$ the $t_{hold-time}=t_{delay2}-t_{delay1}$–clock-low-time will be equal or greater than predefined minimum values. We note that the margins of the setup and hold times are (we will use short notations below—stp for setup, hld for hold, mrgn for margin, del for delay, cl for clock-low time):

$$T_{stp-mrgn}=T_{stp}-T_{stp-min}=t_{del1}-t_{del2}-T_{stp-min}$$

$$T_{hld-mrgn}=T_{hld}-T_{hld-min}=t_{del2}-t_{del1}-t_{cl}-T_{hld-min}$$

In some embodiments, the total margin is equally divided between setup and hold:

$$T_{stp-mrgn}=T_{hld-mrgn}$$

or:

$$t_{del2}-t_{del1}=0.5*(t_{cl}-T_{stp-min}+T_{hld-min}).$$

For example, if the minimum requirements for setup and hold times are equal, the total margin is equal to the clock low time, ideally equally split between setup margin and hold margin.

Method

We will describe herein a method for measuring and calibrating delays of forward propagation paths that are input to a time critical circuit in embodiments according to the present disclosure.

Figure 6:
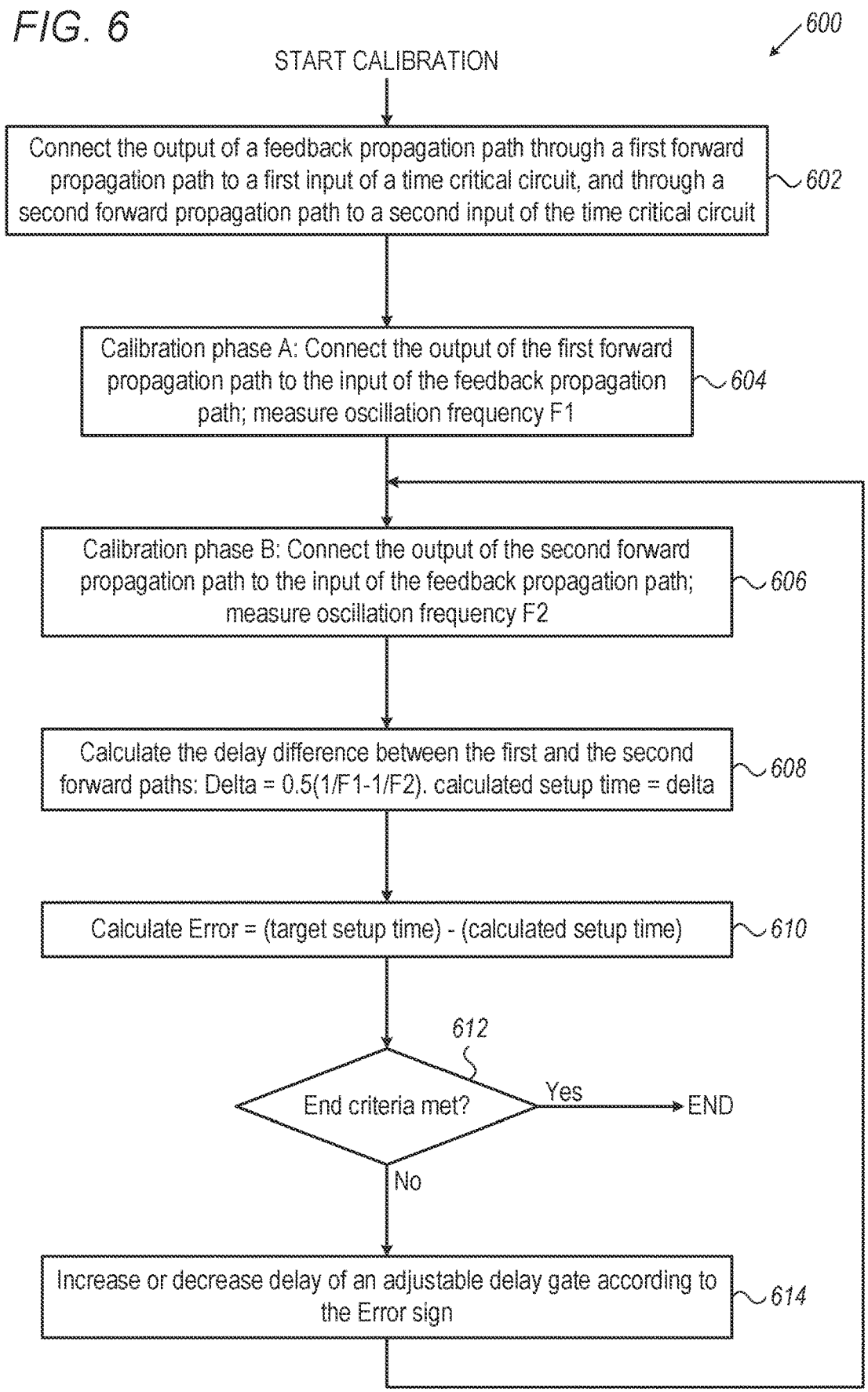
FIG. 6 is a flowchart that schematically illustrates a method for delay measurement and calibration, in accordance with an embodiment that is described herein.

FIG. 6 is a flowchart 600 that schematically illustrates a method for delay measurement and calibration, in accordance with an embodiment that is described herein. The flowchart is executed by calibration control circuitry (CCC hereinbelow), which may include calibration circuit 120, ATE 122 or jointly by both the calibration circuit and the ATE.

The flowchart starts at a connect-feedback-to-forward-paths operation 602, wherein the CCC configures a configuration multiplexer (e.g., configuration multiplexer A 112, FIG. 1) to connect a feedback signal to the inputs of a first and a second forward propagation paths (e.g., forward propagation paths 104, 106, optionally through common forward propagation path 108, FIG. 1). The outputs of the first and the second forward propagation paths are input, respectively, to a first input and a second input of a time critical circuit (e.g., circuit 110, FIG. 1).

The CCC then enters a Calibration-Phase-A operation 604, wherein the CCC connects the output of the first forward propagation path to the input of the feedback path, thus creating an oscillator (the number of inversions in the loop, including inversions in the first forward propagation path and in the feedback propagation path is assumed to be odd). The CCC measures and registers the oscillation frequency, referred to as F1 hereinbelow.

Next, The CCC enters a Calibration-Phase-B operation 606, wherein the CCC connects the output of the second forward propagation path to the input of the feedback path, thus creating an oscillator (the number of inversions, again, is assumed to be odd). The CCC measures and registers this frequency—F2.

Having measured F1 and F2, the CCC now enters a Calculate-Setup operation 608 and calculates the setup time of the data input relative to the clock input (second input relative to first input) of time-critical circuit 110 (FIG. 1). As explain above, the setup is equal to (1/F1−1/F2)/2.

In embodiments, a target setup time is predefined, for example, to evenly distribute a margin between setup and hold time (as explained above). In a Calculate-Error operation 610, the CCC calculates a setup error, which is equal to the difference $T_{measured}-T_{target}$. The error may be positive, in which case the delay of the second path should be increased—or negative, in which case the delay of the second forward propagation path should be decreased.

Next, in a Check-End operation 612, the CCC checks if one or more end criteria is met. In embodiments the criteria may include: (i) the absolute value of the error is not larger than a preset maximum value; (ii) the number of iterations (times that operation 612 is entered) is larger than a preset maximum value; (iii) the error is positive but the delay in the first forward propagation path cannot be decreased (e.g., a minimum delay value of the adjustable delay element has been reached) (iv) the error is negative but the delay in the first forward propagation path cannot be increased (e.g., a maximum delay value of the adjustable delay element has been reached). In some embodiments, the CCC may send a calibration-complete indication, and indicate the end criterion—thus, a user can tell if the calibration succeeded or failed.

If, in operation 612, no end criterion is met, the CCC enters an increase/decrease operation 614, and decreases the delay of adjustable delay gate 214 (gate 2) if the error is positive The CCC will then reenter a Calibration-phase-B operation 606, to measure F2 with the second forward path delay adjusted.

Thus, by measuring the oscillating frequency of the first forward propagation path and then repeatedly measuring and adjusting the delay of the second forward propagation path, the CCC can calibrate the setup and hold times of a time-critical circuit.

The configuration of flowchart 600 illustrated in FIG. 6 and described hereinabove is an example that is cited by way of example. Other configurations may be used in alternative embodiments. For example, in some embodiments the adjustable delay gate is in the second forward propagation path (the data input of the time critical circuit), and the adjustment will increase the delay if the error is positive. In some embodiments, the calibration loop continues until the error changes sign; then, the errors of the iteration before and after the error changed sign are compared, and the adjustment that resulted in a lower absolute error is selected. In some embodiments, the calibration may include a coarse optimization set followed by a fine optimization set, wherein in the coarse optimization set the CCC finds a minimum by coarse adjustments (e.g., increase or decrease the adjustable delay by 8 units at a time), and, in the fine set, the CCC performs a full resolution adjustment in a narrow range.

Figure 7:
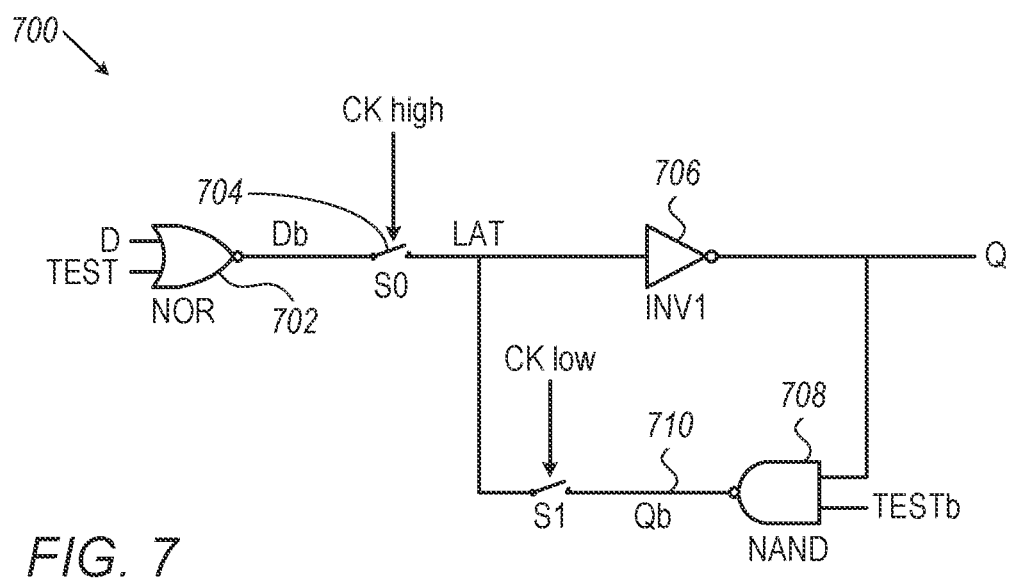
FIG. 7 is a block diagram that schematically illustrates a latch, in accordance with an embodiment that is described herein.

FIG. 7 is a block diagram that schematically illustrates a latch 700, in accordance with an embodiment that is described herein. Latch 700 is configured to operate in two modes—a Functional mode, in which the latch latches last output data when clock (CK) is low and passes input data (D) when clock (CK) is high and a Calibration mode, in which the latch functions as a non-inverting buffer. The propagation delay, from clock to output, is the same in both modes, and hence latch 700 may be used in forward propagation paths that may be connected in a closed loop for frequency measurement, as described above (e.g., latch 219, FIG. 2).

Latch 700 includes a NOR gate that is coupled to a forward switch 704, an inverter 706, feedback NAND gate 708 and a feedback switch 710 (in embodiments, switch 704 and/or switch 710 may include various configurations, for example, a pair of complementary PMOS and NMOS transistors). When in Functional mode, the Calibrate input is at logic low (TEST="0" and TESTB="1") and, hence, NOR gate 702 and NAND gate 708 function as inverters and LATCH 700 functions as a level triggered latch, latching Q and LAT when CK is at logic 0.

When Calibrate mode is on (TEST="1" and TESTB="0"), NOR gate 702 outputs a logic low, while NAND gate 708 outputs a logic high. When the clock is at logic-low, inverter 706 inverts the logic-high output of NAND gate 708, and, hence, the Q output is at logic low; when the clock is at logic-high, inverter 706 inverts the logic-low output of NOR gate 708, and, hence, the Q output is at logic high. Thus, when in Calibration mode, latch 700 functions as a buffer, with CK as input and Q as output.

The path from CK input to Q output within latch 700 includes the same gates and switches, whether the latch is in Calibrate or in Functional mode and, hence, in both cases the delay from CK to Q will be equal.

Thus, in embodiments, latches in forward propagation paths to time critical circuits may be reconfigured to function as gates when the IC is in Calibration mode, having the same clock to output delay in Functional and in Calibration mode.

The configuration of latch 700 illustrated in FIG. 7 and described hereinabove is cited by way of example. Other configurations may be used in alternative embodiments. For example, in an embodiment, a differential current-mode latch can be used, with add circuitry to set its input to be differential high and latch node to be differential low, with the latching cross-couple pair disabled during calibration mode.

The configuration of IC 100, including configuration multiplexer A 112, configuration multiplexer B 114, and latch 700, including all subunits thereof, as well as flowchart 600 and waveform 300, are example configurations, flowcharts and waveforms that are shown purely for the sake of conceptual clarity. Any other suitable configurations, methods and waveforms can be used in alternative embodiments.

In various embodiments, IC 100 or subunits thereof may be implemented using suitable hardware, such as one or more Application-Specific Integrated Circuits (ASIC) or Field-Programmable Gate Arrays (FPGA), or a combination of ASIC and FPGA.

Although the embodiments described herein mainly address in-situ measurement and calibration of timing paths, the methods and systems described herein can also be used in other applications, such as in characterizing the range and resolution of delay adjustment circuits, measurement of internal delays, monitoring of process variations and indirect measurement of voltage/temperature.

Figure 8:
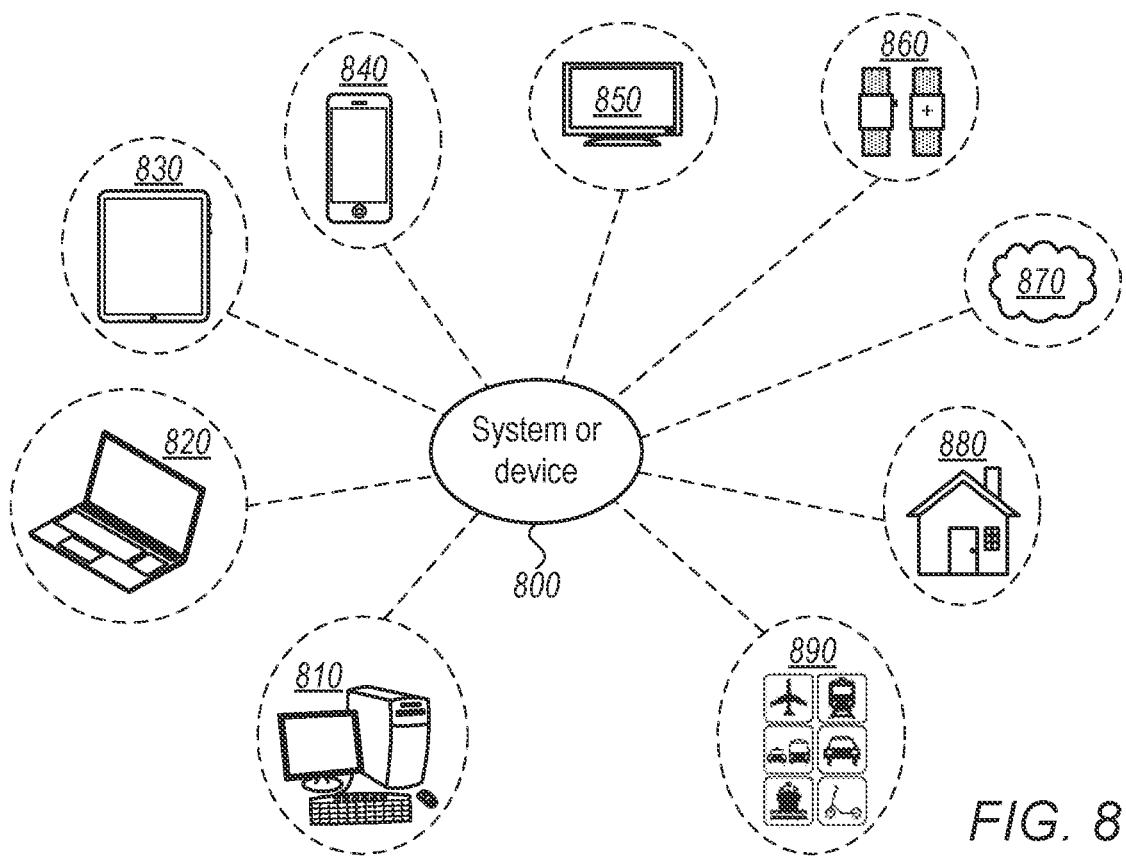
FIG. 8 is a diagram that schematically illustrates various types of systems that may include any of the circuits, devices, or system discussed above, in accordance with embodiments that are described herein.

FIG. 8 is a diagram 800 that schematically illustrates various types of systems that may include any of the circuits, devices, or system discussed above, in accordance with embodiments that are described herein. System or device 800, which may incorporate or otherwise utilize one or more of the techniques described herein, may be utilized in a wide range of areas. For example, system or device 800 may be utilized as part of the hardware of systems such as a desktop computer 810, laptop computer 820, tablet computer 830, cellular or mobile phone 840, or television 850 (or set-top box coupled to a television).

Similarly, disclosed elements may be utilized in a wearable device 860, such as a smartwatch or a health-monitoring device. Smartwatches, in many embodiments, may implement a variety of different functions, for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 800 may also be used in various other contexts. For example, system or device 800 may be utilized in the context of a server computer system, such as a dedicated server or on shared hardware that implements a cloud-based service 870. Still further, system or device 800 may be implemented in a wide range of specialized everyday devices, including devices 880 commonly found in the home such as refrigerators, thermostats, security cameras, etc. The interconnection of such devices is often referred to as the "Internet of Things" (IoT). Elements may also be implemented in various modes of transportation. For example, system or device 800 could be employed in the control systems, guidance systems, entertainment systems, etc. of various types of vehicles 890.

The applications illustrated in FIG. 8 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 9:
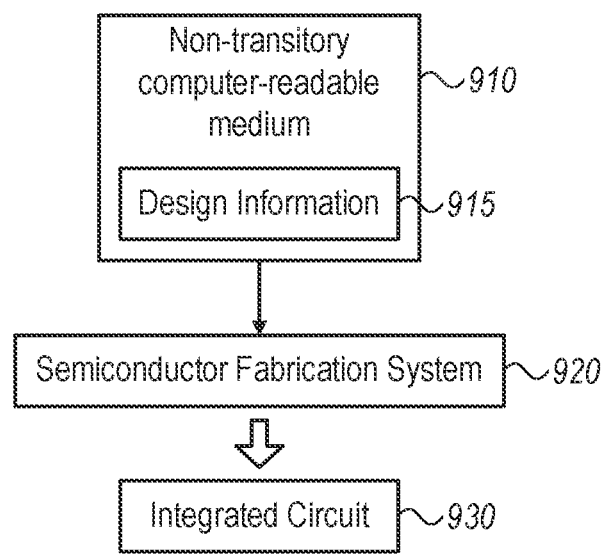
FIG. 9 is a block diagram illustrating an example non-transitory computer-readable storage medium that stores circuit design information, in accordance with embodiments described herein.

FIG. 9 is a block diagram illustrating an example non-transitory computer-readable storage medium that stores circuit design information, according to some embodiments. In the illustrated embodiment semiconductor fabrication system 920 is configured to process the design information 915 stored on non-transitory computer-readable medium 910 and fabricate integrated circuit 930 based on the design information 915.

Non-transitory computer-readable storage medium 910, may include any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system 920. In some embodiments, design information 915 may also include one or more cell libraries which specify the synthesis, layout, or both of integrated circuit 930. In some embodiments, the design information is specified in whole or in part in the form of a netlist that specifies cell library elements and their connectivity. Design information 915, taken alone, may or may not include sufficient information for fabrication of a corresponding integrated circuit. For example, design information 915 may specify the circuit elements to be fabricated but not their physical layout. In this case, design information 915 may need to be combined with layout information to actually fabricate the specified circuitry.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown in FIGS. 1, 2, 4, 5 and 7. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of 2.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations.

This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

The invention claimed is:

1. An Integrated Circuit (IC), comprising:
a target circuit, comprising first and second inputs having a timing constraint therebetween;
a first logic chain, configured to propagate a signal from a common input point in the IC to the first input of the target circuit;
a second logic chain, configured to propagate the signal from the common input point to the second input of the target circuit;
a feedback propagation path, configured to selectably receive the signal from the first or second input of the target circuit, and to feed the signal back to the common input point; and
calibration circuitry, configured to:
connect the first input of the target circuit to the feedback path, thereby forming a first closed-loop oscillator circuit comprising the first logic chain and the feedback propagation path, and measure a first oscillation frequency of the first closed-loop oscillator circuit;
connect the second input of the target circuit to the feedback path, thereby forming a second closed-loop oscillator circuit comprising the second logic chain and the feedback propagation path, and measure a second oscillation frequency of the second closed-loop oscillator circuit; and
verify the timing constraint responsively to the first and second oscillating frequencies.

2. The IC according to claim 1, wherein, to verify the timing constraint, the calibration circuitry is configured to estimate a timing skew between the first and second inputs based on the first and second oscillating frequencies, and to verify whether the timing skew satisfies the timing constraint.

3. The IC according to claim 1, wherein the first logic chain comprises an adjustable delay element, and wherein, to verify the timing constraint, the calibration circuitry is further configured to adjust the adjustable delay element responsively to the first and second oscillating frequencies, so as to meet the timing constraint.

4. The IC according to claim 1, wherein the timing constraint is a predefined setup time.

5. The IC according to claim 1, wherein the timing constraint is a predefined hold time.

6. The IC according to claim 1, wherein the calibration circuitry is configured to switch between:
a normal mode in which an input signal is propagated to the target circuit via the first and second logic chains, and the feedback propagation path is disconnected; and
a calibration mode in which the first and second closed-loop oscillator circuits are formed using the feedback propagation path and the first and second logic chains, and the timing constraint is verified.

7. The IC according to claim 6, comprising a modified latch circuit (MLC) configured to:
in the normal mode of the calibration circuitry, operate in a normal latching mode in which the MLC transfers a data input to a data output responsively to a level of a clock input; and
in the calibration mode of the calibration circuitry, operate in a feed-through mode in which the MLC propagates the clock input to the data output after a delay, which matches the delay in the normal latching mode from the clock edge to the data output.

8. The IC according to claim 7, wherein the MLC comprises one or more gates, which are configured to force respective given logic levels on the MLC while in the calibration mode.

9. The IC according to claim 1, wherein the target circuit comprises a synchronous logic stage, wherein the first input is a data input for receiving a data signal, and wherein the second input is a clock input for receiving a clock signal.

10. The IC according to claim 9, wherein the target circuit comprises at least a latch that is configured to sample the data signal with the clock signal.

11. The IC according to claim 9, wherein the target circuit comprises a multiplexer.

12. A method for verifying a timing constraint between first and second inputs of a target circuit within an Integrated Circuit (IC), the method comprising:
using a first logic chain, propagating a signal from a common input point in the IC to the first input of the target circuit;
using a second logic chain, propagating the signal from the common input point to the second input of the target circuit;
using a feedback propagation path, selectably receiving the signal from the first or second input of the target circuit, and feeding the signal back to the common input point; and
using calibration circuitry:
connecting the first input of the target circuit to the feedback path, thereby forming a first closed-loop oscillator circuit comprising the first logic chain and the feedback propagation path, and measuring a first oscillation frequency of the first closed-loop oscillator circuit;
connecting the second input of the target circuit to the feedback path, thereby forming a second closed-loop oscillator circuit comprising the second logic chain and the feedback propagation path, and measuring a second oscillation frequency of the second closed-loop oscillator circuit; and
verifying the timing constraint responsively to the first and second oscillating frequencies.

13. The method according to claim 12, wherein verifying the timing constraint comprises estimating a timing skew between the first and second inputs based on the first and second oscillating frequencies, and verifying whether the timing skew satisfies the timing constraint.

14. The method according to claim 12, wherein verifying the timing constraint comprises adjusting an adjustable delay element in the first logic chain responsively to the first and second oscillating frequencies, so as to meet the timing constraint.

15. The method according to claim 12, wherein the timing constraint is a predefined setup time.

16. The method according to claim 12, wherein the timing constraint is a predefined hold time.

17. The method according to claim 12, wherein connecting the first and second inputs comprises switching between:
   a normal mode in which an input signal is propagated to the target circuit via the first and second logic chains, and the feedback propagation path is disconnected; and
   a calibration mode in which the first and second closed-loop oscillator circuits are formed using the feedback propagation path and the first and second logic chains, and the timing constraint is verified.

18. The method according to claim 17, further comprising:
   in the normal mode of the calibration circuitry, operating a modified latch circuit (MLC) in the IC as a normal latch, in which the MLC transfers a data input to a data output responsively to a level of a clock input; and
   in the calibration mode of the calibration circuitry, operating the MLC in a feed-through mode in which the MLC propagates the clock input to the data output after a delay, which matches the delay in the normal latching mode from the clock edge to the data output.

19. The method according to claim 18, wherein operating the MLC comprises forcing one or more given logic levels on the MLC while in the calibration mode, using one or more gates.

20. The method according to claim 12, wherein the target circuit comprises a synchronous logic stage, wherein the first input is a data input for receiving a data signal, and wherein the second input is a clock input for receiving a clock signal.

\* \* \* \* \*